(12) United States Patent
Bernard-Granger et al.

(10) Patent No.: US 9,653,135 B2
(45) Date of Patent: May 16, 2017

(54) MULTI-PORT NON-VOLATILE MEMORY

(71) Applicants: Commissariat à l'Énergie Atomique et aux Énergies Alternatives, Paris (FR); Centre National de la Recherche Scientifique, Paris (FR)

(72) Inventors: Fabrice Bernard-Granger, Le Sappey en Chartreuse (FR); Virgile Javerliac, Grenoble (FR)

(73) Assignees: Commissariat à l'Énergie Atomique et aux Énergies Alternatives, Paris (FR); Centre National de la Recherche Scientifique, Paris (FR)

( * ) Notice: Subject to any disclaimer, the term of this patent is extended or adjusted under 35 U.S.C. 154(b) by 0 days.

(21) Appl. No.: 15/111,189

(22) PCT Filed: Dec. 15, 2014

(86) PCT No.: PCT/FR2014/053336
§ 371 (c)(1),
(2) Date: Jul. 13, 2016

(87) PCT Pub. No.: WO2015/110723
PCT Pub. Date: Jul. 30, 2015

(65) Prior Publication Data
US 2016/0336052 A1 Nov. 17, 2016

(30) Foreign Application Priority Data

Jan. 22, 2014 (FR) ..................... 14 50533

(51) Int. Cl.
*G11C 11/00* (2006.01)
*G11C 11/16* (2006.01)
(Continued)

(52) U.S. Cl.
CPC .............. *G11C 11/161* (2013.01); *G11C 8/16* (2013.01); *G11C 11/1673* (2013.01);
(Continued)

(58) Field of Classification Search
CPC ........ G11C 11/00; G11C 11/161; G11C 11/16
(Continued)

(56) References Cited

U.S. PATENT DOCUMENTS

2011/0228594 A1* 9/2011 Rao .......................... G11C 8/16
365/158
2013/0163319 A1* 6/2013 Rao .......................... G11C 8/16
365/158
(Continued)

OTHER PUBLICATIONS

Written Opinion, dated Mar. 4, 2015, from corresponding International Application No. PCT/FR2014/053336.
(Continued)

*Primary Examiner* — Harry W Byrne
(74) *Attorney, Agent, or Firm* — Wolf, Greenfield & Sacks, P.C.

(57) ABSTRACT

A multi-port memory cell including: first and second magnetoresistive elements, each of which is programmable so as to adopt at least two resistive states, in which: the first magnetoresistive element is coupled with a first output line and is programmable by the direction of a current which is passed through same; and the second magnetoresistive element is coupled with a second output line and is arranged so as to be magnetically coupled with the first magnetoresistive element, the second magnetoresistive element being programmable by a magnetic field generated by the first magnetoresistive element.

14 Claims, 3 Drawing Sheets

(51) Int. Cl.
  *G11C 8/16* (2006.01)
  *G11C 11/56* (2006.01)
  *H01L 27/22* (2006.01)
  *H01L 43/02* (2006.01)
  *H01L 43/08* (2006.01)
  *H01L 43/12* (2006.01)
(52) U.S. Cl.
  CPC ...... *G11C 11/1675* (2013.01); *G11C 11/5607* (2013.01); *H01L 27/222* (2013.01); *H01L 43/02* (2013.01); *H01L 43/08* (2013.01); *H01L 43/12* (2013.01)
(58) Field of Classification Search
  USPC ................ 365/129, 145, 148, 158, 163, 203
  See application file for complete search history.

(56) References Cited

U.S. PATENT DOCUMENTS

| | | | |
|---|---|---|---|
| 2014/0070844 A1 | 3/2014 | Guillemenet et al. | |
| 2014/0098613 A1* | 4/2014 | Kim ..................... | G11C 11/005 365/185.18 |

OTHER PUBLICATIONS

International Search Report, dated Mar. 4, 2015, from International Application No. PCT/FR2014/05336.
Bi et al.: "STT-RAM designs supporting dual port accesses," (2013) Design, Automation and test in Europe, EDA Consortium; pp. 853-858.

* cited by examiner

MULTI-PORT NON-VOLATILE MEMORY

CROSS-REFERENCE TO RELATED APPLICATIONS

This application is the national phase of International Application No. PCT/FR2014/053336, filed on Dec. 15, 2014, which claims priority to French patent application 14/50533, filed on Jan. 22, 2014, both of which applications are hereby incorporated by reference to the maximum extent allowable by law.

FIELD

The present disclosure relates to the field of multiport memories, and in particular to a multiport non-volatile memory cell of a memory array.

BACKGROUND

It has been proposed to use programmable magnetoresistive elements in memory cells to provide non-volatile data storage. Such elements are programmable to adopt one of two different resistive states. The programmed resistive state is maintained even when a supply voltage of the memory cell is disconnected, and thus data can be stored by such elements in a non-volatile fashion.

Various types of magnetoresistive elements have been proposed, some of which are capable of being programmed by the direction of a current that is passed through the element. An example of such a current-programmable magnetoresistive element is a magnetic tunnel junction having a write mechanism based on STT (spin transfer torque).

In order to increase the data bandwidth of operations performed between one or more processors and a memory, it has been proposed to use multiport memories in which each memory cell may be read and written at the same time.

However, there is a difficulty in providing a multiport non-volatile memory cell that is efficient in terms of energy consumption during write operations and/or that provides robust data storage during read operations.

SUMMARY

It is an aim of embodiments of the present description to at least partially address one or more difficulties in the prior art.

According to one aspect, there is provided a multiport memory cell comprising: first and second magnetoresistive elements each programmable to have one of at least two resistive states, wherein: the first magnetoresistive element is coupled to a first output line and is programmable by the direction of a current passed through it; and the second magnetoresistive element is coupled to a second output line and is arranged to be magnetically coupled to the first magnetoresistive element, the second magnetoresistive element being programmable by a magnetic field generated by the first magnetoresistive element.

According to one embodiment, the memory cell further comprises at least one further magnetoresistive element programmable to have one of at least two resistive states, wherein each of the at least one further magnetoresistive element is arranged to be programmable by a magnetic field generated by the first or second magnetoresistive element.

According to one embodiment, the second magnetoresistive element comprises a free ferromagnetic layer arranged to be programmed by a magnetic field generated by a free ferromagnetic layer of the first magnetoresistive element, for example while a programming current is passed through the first magnetoresistive element.

According to one embodiment, the memory cell further comprising a magnetic flux guide arranged to guide magnetic flux between the first and second magnetoresistive elements.

According to one embodiment, the first and second magnetoresistive elements comprise free ferromagnetic layers of different dimensions from each other.

According to one embodiment, the average resistance of the resistive states of the first magnetoresistive element is lower than that of the second magnetoresistive element.

According to one embodiment, each of the first and second magnetoresistive elements is one of: a magnetic tunnel junction with in-plane anisotropy; and a magnetic tunnel junction with perpendicular-to-plane anisotropy.

According to one embodiment, the first and second magnetoresistive elements are magnetic tunnel junctions with in-plane anisotropy; the second magnetoresistive element is further programmable by a current passed through it; and the first magnetoresistive element is further programmable by a magnetic field generated by the second magnetoresistive element.

According to one embodiment, the memory cell further comprises at least one further magnetoresistive element programmable to have one of at least two resistive states, the first, second and at least one further magnetoresistive elements being magnetic tunnel junctions with in-plane anisotropy arranged in a line.

According to one embodiment, the first and second magnetoresistive elements are magnetic tunnel junctions with in-plane anisotropy separated from each other by a distance of between 100 and 300 nm.

According to one embodiment, the memory cell further comprises at least one further magnetoresistive element programmable to have one of at least two resistive states, the first, second and at least one further magnetoresistive elements are magnetic tunnel junctions with perpendicular-to-plane anisotropy, and the second and at least one further magnetoresistive elements are each positioned an equal distance from the first magnetoresistive element.

According to one aspect, there is provided a memory device comprising: an array of the above memory cells, and a read/write circuit adapted to program the resistive state of the first magnetoresistive element and read the resistive state of the second magnetoresistive element.

According to one aspect, there is provided a method of forming a multiport memory cell comprising: forming first and second magnetoresistive elements each programmable to have one of at least two resistive states, the elements being separated by a distance chosen such that the second magnetoresistive element is magnetically coupled to the first magnetoresistive element and is programmable by a magnetic field generated by the first magnetoresistive element; coupling the first magnetoresistive element to a first output line; and coupling the second magnetoresistive element to a second output line.

According to one embodiment, the method further comprises forming a magnetic flux guide for guiding magnetic flux between the first and second magnetoresistive elements.

BRIEF DESCRIPTION OF THE DRAWINGS

The foregoing and other features and advantages will become apparent from the following detailed description of embodiments, given by way of illustration and not limitation with reference to the accompanying drawings, in which.

DETAILED DESCRIPTION

Throughout the following description, the term "connected" is used to refer to a direct connection between one element and another, while the term "coupled" implies that the connection between the two elements may be direct, or via an intermediate element, such as a transistor, resistor or other component.

Figure 1:
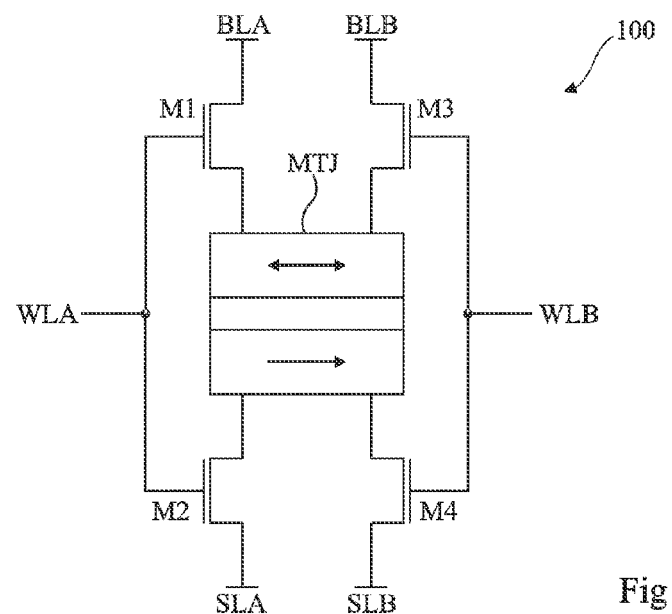
FIG. 1 schematically illustrates an example of a dual-port non-volatile memory cell.

FIG. 1 illustrates a dual-port STT-RAM cell 100 and substantially reproduces FIG. 2(a) of the publication entitled "STT-RAM Designs Supporting Dual-Port Accesses", Xiuyuan Bi et al., Design, Automation and Test in Europe Conference and Exhibition, 18-22 Mar. 2013, Grenoble, France.

A magnetic tunnel junction MTJ has four terminals. Two of the terminals form a port A, one of these terminals being coupled to a bit line BLA via a transistor M1 and the other being coupled to a selection line SLA via a transistor M2. The transistors M1 and M2 are controlled by a word line WLA associated with port A. The other two terminals of the MTJ form a port B, one of these terminals being coupled to a bit line BLB via a transistor M3 and the other being coupled to a selection line SLB via a transistor M4. The transistors M3 and M4 are controlled by a word line WLB associated with port B.

A drawback of the STT-RAM cell 100 of FIG. 1 is that a relatively high current will be necessary to program the resistive state of the MTJ, and relatively low currents must be used by each port to read the resistive state of the MTJ, as otherwise there is a risk that read operations will inadvertently reprogram the MTJ. Furthermore, if read operations are performed via both of the ports at the same time, there is a risk of interference between these operations, and also a risk that one or both of the MTJs will be written. Indeed, the two paths in the cell 100 of FIG. 1 are electrically coupled by the MTJ.

Figure 2:
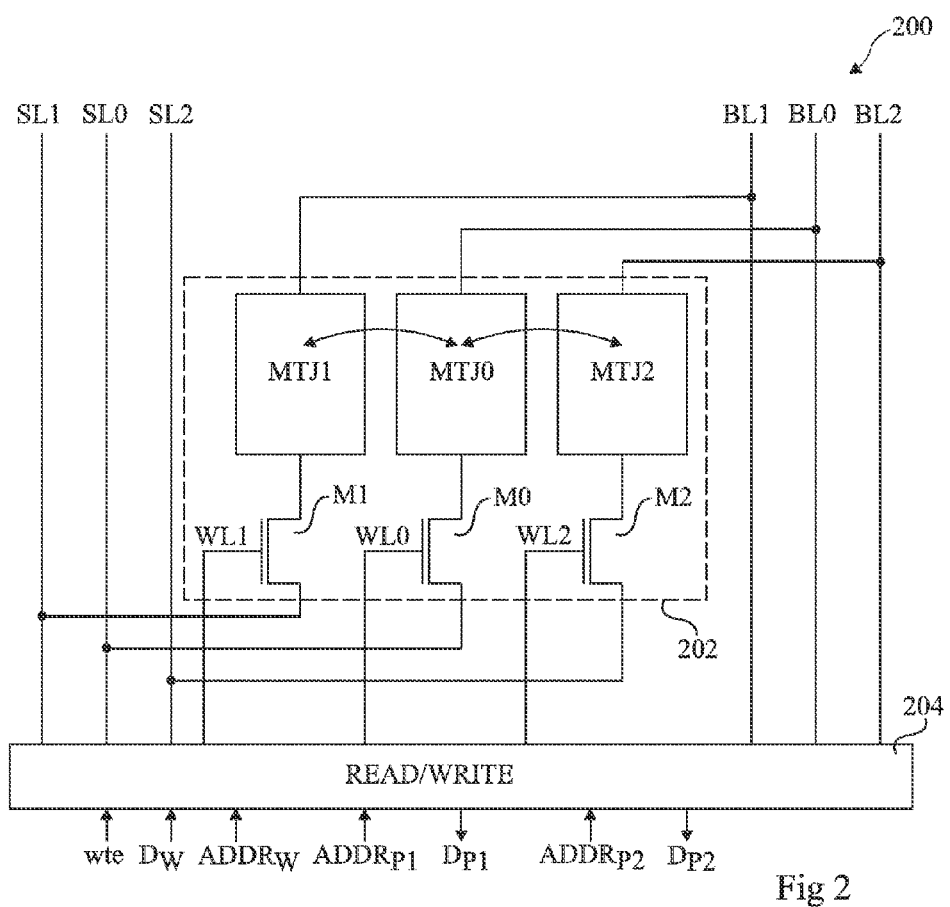
FIG. 2 schematically illustrates a multiport non-volatile memory cell according to an example embodiment of the present disclosure.

FIG. 2 schematically illustrates a portion 200 of a memory device comprising an array of multiport non-volatile memory cells 202, only one of which is illustrated in FIG. 2.

The memory cell 202 comprises a plurality of magnetoresistive elements, in the example of FIG. 2 there being three elements labelled MTJ0, MTJ1 and MTJ2. In alternative embodiments, the memory cell 202 could comprise only two magnetoresistive elements, or more than three such elements.

Each of the magnetoresistive elements is for example a magnetic tunnel junction having a resistance that is programmable by the direction of a current passed through it. For example, each of the elements MTJ0 to MJT2 is an MTJ that is written based on STT (spin-torque-transfer), and has in-plane or perpendicular-to-plane anisotropy. Such elements are described in more detail in the publication entitled "Magnonic spin-transfer torque MRAM with low power, high speed, and error-free switching", N. Mojumder et al., IEDM Tech. Digest (2010), and in the publication entitled "Electric toggling of magnets", E. Tsymbal, Natural Materials Vol 11, January 2012.

Whatever the type of magnetoresistive element, a bit of data is for example stored in a non-volatile manner by programming the element to have either a relatively high resistance (Rmax) or a relatively low resistance (Rmin). Each of the magnetoresistive elements for example has just two resistive states corresponding to the high and low resistances Rmax and Rmin, but the exact values of Rmin and Rmax may vary depending on conditions such as process, materials, temperature variations etc. The elements MTJ0 to MTJ2 are for example selected such that Rmax is always significantly greater than Rmin, for example at least 20 percent greater. In general, the ratio between the resistance Rmax and the resistance Rmin is for example between 1.2 and 1000. Rmin is for example in the region of 2 kohms or less, and Rmax is for example in the region of 6 kohms or more, although many other values are possible.

The memory cell 202 also comprises a selection transistor coupled in series with each magnetoresistive element. For example, a transistor M0 controlled by a selection signal WL0 is coupled between one node of the element MTJ0 and a selection line SL0, a transistor M1 controlled by a selection signal WL1 is coupled between one node of the element MTJ1 and a selection line SL1, and a transistor M2 controlled by a selection signal WL2 is coupled between one node of the element MTJ2 and a selection line SL2. The other nodes of the elements MTJ0 to MTJ2 are for example coupled to bit lines BL0 to BL2 respectively. The transistors M0 to M2 are for example NMOS transistors or PMOS transistors.

A read/write circuit 204 is used for programming the resistive state of the magnetoresistive elements MTJ0 to MTJ2. The element MTJ0 is shown positioned between the elements MTJ1 and MTJ2 in FIG. 3, and as represented by arrows extending between the element MTJ0 and the elements MTJ1 and MTJ2 on each side, there is magnetic coupling between the elements. Therefore, it is sufficient to program the resistive state of the element MTJ0 by applying an appropriate programming current, and the resulting magnetic field will cause the resistive states of the adjacent elements MTJ1 and MTJ2 to also be programmed based on the programmed state of the element MTJ0. Thus the same data is shared among all of the MTJs and can then be read from any of the elements MTJ0 to MTJ2.

The read/write circuit 204 for example comprises a write input for receiving a signal wte indicating when a write operation is to be performed, a data input for receiving a data signal Dw indicating the data to be written, a write address input for receiving a write address ADDRw of the memory cell to be written, a port 1 address input for receiving an address ADDRP1 of the memory cell to be read via port 1, a port 1 data output DP1 for providing the data read at the port 1 address ADDRP1, a port 2 address input for receiving an address ADDRP2 of the memory cell to be read via port 2, and a port 2 data output DP2 for providing the data read at the port 2 address ADDRP2. Port 1 for example corresponds to the magnetoresistive element MTJ1 of each memory cell of the array, and port 2 for example corresponds to the magnetoresistive element MTJ2 of each memory cell of the array.

In the embodiment shown in FIG. 2, the magnetoresistive element MTJ0 is reserved for write operations. Element MTJ0 for example has a structure adapted to facilitate the programming of its resistive state by a current. For example, the average resistance of the resistive states Rmin, Rmax of the element MTJ0 is less than that of the elements MTJ1 and MTJ2, enabling a lower programming power consumption. Furthermore, a higher average resistance and a higher delta resistance of the resistive states Rmin and Rmax of the elements MTJ1 and MTJ2 eases the reading process by helping the Rmin state to be discriminated from the Rmax state.

In alternative embodiments, the magnetoresistive elements MTJ0, MTJ1 and MTJ2 have the same structure and are all capable of being programmed by an applied programming current. In such a case, the memory cell can be written via any of the ports. Furthermore, the read/write circuit 204 then for example comprises a write address input, write data input, read address input and read data output associated with each element MTJ0, MTJ1, MTJ2.

Programming the resistive state of the element MTJ0, MTJ1 or MTJ2 involves applying a current through the element in a direction based on the state to be programmed. For this, a voltage is applied, in a direction based on the data to be written, between the selection line and bit line corresponding to the element to be programmed. The corresponding selection transistor M0, M1 or M2 is then activated to cause a current to flow through the element MTJ0, MTJ1 or MJT2 to program its state.

Reading the programmed resistive state of the element MTJ0, MTJ1 or MTJ2 involves applying a voltage across the element to be read using the corresponding selection line SL0, SL1, SL2 and the corresponding bit line BL0, BL1, BL2, and activating the corresponding selection transistor M0, M1 or M2. The resulting current is then compared to a reference current, which is for example generated by a reference device of the read/write circuit 204 having a resistance equal to (Rmax+Rmin)/2. The reference current provides a cut-off level for determining whether the element has a programmed resistance of Rmin or Rmax.

FIG. 2 illustrates only one memory cell 202, but it will be apparent to those skilled in the art how a plurality of such memory cells could be arranged in rows and columns to form an array. In particular, there may be one or more additional memory cells in the same column as the one shown in FIG. 2, and coupled to the same selection lines SL0 to SL2 and bit lines BL0 to BL2. Furthermore, there may be one or more further columns of memory cells having further selection lines and bit lines. The memory cells of a same row of the memory array for example receive the same selection signals WL0 to WL2.

Figure 3A:
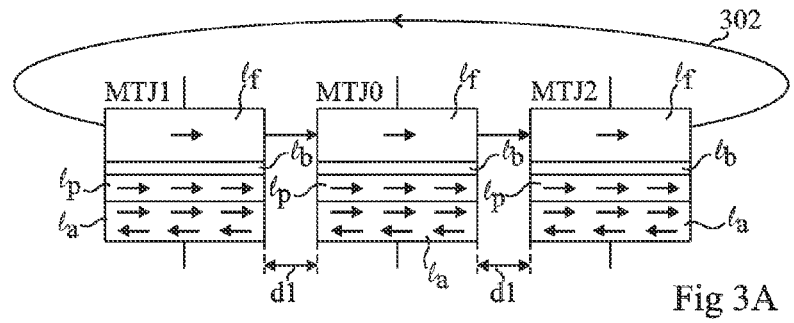
FIG. 3A schematically illustrates magnetoresistive elements forming the memory cell of FIG. 2 according to an example embodiment of the present disclosure.

FIG. 3A schematically illustrates an arrangement of the elements MTJ0, MTJ1 and MTJ2 of the memory cell 202 of FIG. 2 according to an example in which they are elements of STT type with in-plane anisotropy. Each element MTJ0, MTJ1, MTJ2 is for example substantially cylindrical, but has a cross-section which is non-circular, for example elliptical, which leads to an increase in the retention stability of the resistive states when the device is programmed.

Figure 3B:
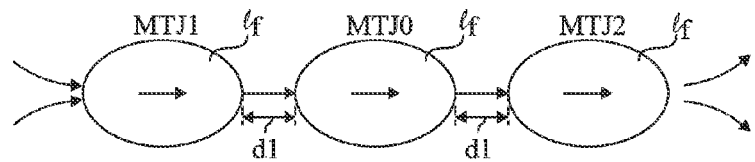
FIGS. 3B and 3C are plan views schematically illustrating magnetoresistive elements forming the memory cell of FIG. 2 according to example embodiments of the present disclosure.

FIG. 3B is a plan view schematically illustrating free layers lf of the elements MTJ0 to MTJ2 of FIG. 3A, and showing an example of their elliptical form.

Referring again to FIG. 3A, each element comprises a stack formed of, from bottom to top, an anti-ferromagnetic layer la, a pinned layer lp, a barrier tunnelling layer lb and a free layer lf. Additionally, while not illustrated in FIG. 3A, electrodes may be provided at the top and bottom of the stack for contact with the connecting lines.

The pinned layer lp forms a reference layer with a fixed magnetisation direction and is for example formed of an alloy based on Co, Fe, Ni and/or Bo, such as CoFeBo or CoFeNi.

The anti-ferromagnetic layer la is used to pin the reference layer lp, and for example comprises an alloy based on Pt, Mn and/or Ir, such as PtMn or IrMn.

The barrier tunnelling layer lb is for example formed of an oxide such as AlxOy, for example Al2O3 or MgO.

The free layer lf has a magnetisation direction that can be programmed. In the example of FIG. 3A, the magnetisation direction in elements MTJ0 to MTJ2 has been programmed to be from left to right in the figure, which is the same as that of the pinned layer lp, resulting in a programmed resistive state of Rmin. An opposite programming would correspond to a magnetisation direction in the free layer from right to left in the figure, resulting in a programmed resistive state of Rmax. The free layer is for example formed of an alloy based on Co, Fe, Ni and/or Bo, such as CoFeBo or CoFeNi. Thus the free layer lf is used to generate the magnetic field responsible for the magnetic coupling between the various adjacent MTJs.

As represented by an arrow 302 in FIG. 3A, the elements MTJ0 to MTJ2 are arranged such that the magnetic field generated by the magnetisation of the free layers forms a loop passing through the free layer lf of each of the elements. In this way, the elements are magnetically coupled with each other, and all of the elements are programmed in the same direction.

Such a magnetic coupling is for example achieved by aligning the free layers lf of each element with each other, and separating adjacent elements by a distance d1. In general, the distance d1 is for example between 100 and 300 nm. The distance is dependent on the dimensions of the elements MTJ0 to MTJ2. For example, assuming that the elements have an elliptical form with an aspect ratio length/width of between 1.5 and 3, a length of between 20 and 100 nm, a thickness of the free layer lf of between 2 and 5 nm, a thickness of the barrier layer lb of between 1 and 2 nm, a thickness of the pinned layer lp of between 2 and 5 nm, and a thickness of the anti-ferromagnetic layer 1a of between 2 and 5 nm, the distance d1 is for example of between 100 and 200 nm.

Figure 3C:
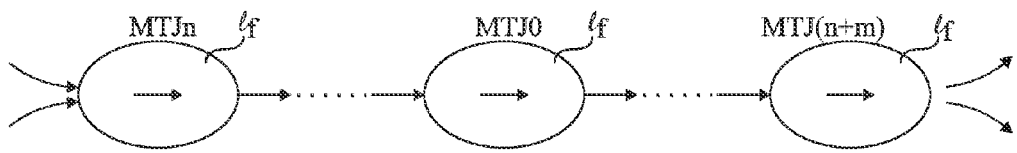

FIG. 3C is a plan view similar to that of FIG. 3B, but illustrates the case in which there is a chain comprising more that three magnetoresistive elements. In particular, there are n elements MTJ1 to MTJn positioned to the left of the element MTJ0, and m elements MTJ(n+1) to MTJ(n+m) positioned to the right of element MTJ0. The variables n and m could each be any integer greater than 1, and need not be equal. The maximum number of elements that can be programmed by the programming of a single element in the chain will depend on factors such as the dimensions of the elements, the distance between the elements, and the level of current used during the programming operation.

Figure 3D:
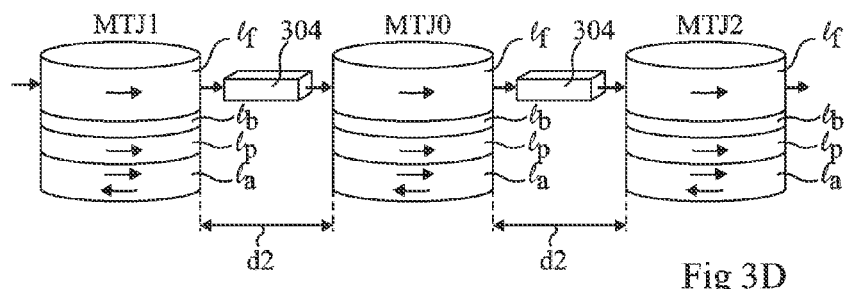
FIG. 3D is a perspective view schematically illustrating magnetoresistive elements forming the memory cell of FIG. 2 according to an example embodiment of the present disclosure.

FIG. 3D is a perspective view of the elements MTJ0, MTJ1 and MTJ2 illustrating an embodiment in which a magnetic flux guide 304 is positioned between and aligned with the free layers lf of adjacent elements. Such a flux guide 304 improves the magnetic coupling between the MTJs. For example, it has a rectangular cross-section, with a height and depth chosen based on the dimensions of the free layers lf. Alternatively, it could have a polygonal or ellipsoidal form. The length of each flux guide 304 is for example of between 100 and 200 nm, allowing the distance d2 separating adjacent elements in FIG. 3D to be increased to between 200 and 500 nm. The guide 304 is for example formed of a permalloy such as Ni80Fe20.

Figure 4A:
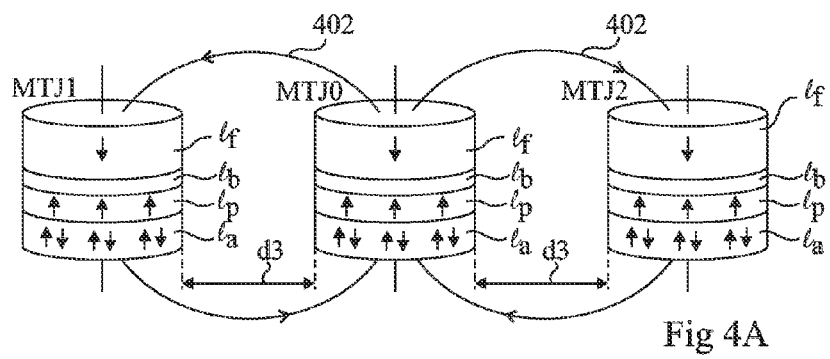
FIG. 4A is a perspective view schematically illustrating magnetoresistive elements of the memory cell of FIG. 2 according to a further example embodiment of the present disclosure.

FIG. 4A is a perspective view illustrating the magnetoresistive elements MTJ0 to MTJ2 of FIG. 2 according to an alternative embodiment to that of FIG. 3A, in which the elements are of STT type with perpendicular-to-plane magnetic anisotropy. The elements MTJ0 to MTJ2 of FIG. 4A are substantially cylindrical, and for example have cross-sections which are circular.

As with the elements in FIG. 3A, each element of FIG. 4A comprises a stack formed of, from bottom to top, an anti-ferromagnetic layer la, a pinned layer lp, a barrier tunnelling layer lb and a free layer lf. These layers can be formed of the same lists of materials described above in relation to FIG. 3A. Additionally, while not illustrated in FIG. 3A, electrodes may be provided at the top and bottom of the stack for contact with the connecting lines.

The pinned layer lp of each element for example has an upward magnetisation direction, as represented by upward arrows in FIG. 4A. The free layer lf of element MTJ0 is for example programmed to have the same magnetisation direction as the pinned layers lp, and the resulting magnetic field represented by loops 402 in FIG. 4A causes the elements MTJ1 and MTJ2 to have downward magnetisation directions in their free layers lf in the opposite direction to the pinned layers lp. The free layer lf of element MTJ0 can be programmed in the opposite direction to have a downward magnetisation direction, in which case the magnetic field 402 would be in the opposite direction, causing the elements MTJ1 and MTJ2 to have upward magnetisation directions in their free layers lf.

The distance d3 separating adjacent elements MTJ0 to MTJ2 in FIG. 4A is chosen to cause magnetic coupling between the elements, and will depend on the magnetisation strength resulting from factors such as the dimensions of the elements. For example, assuming that the elements each have a diameter of between 20 and 100 nm, a thickness of the free layer lf of between 2 and 5 nm, a thickness of the barrier layer lb of between 1 and 2 nm, a thickness of the pinned layer lp of between 2 and 5 nm, and a thickness of the anti-ferromagnetic layer la of between 2 and 5 nm, the distance d3 is for example equal to around 100 nm.

Figure 4B:
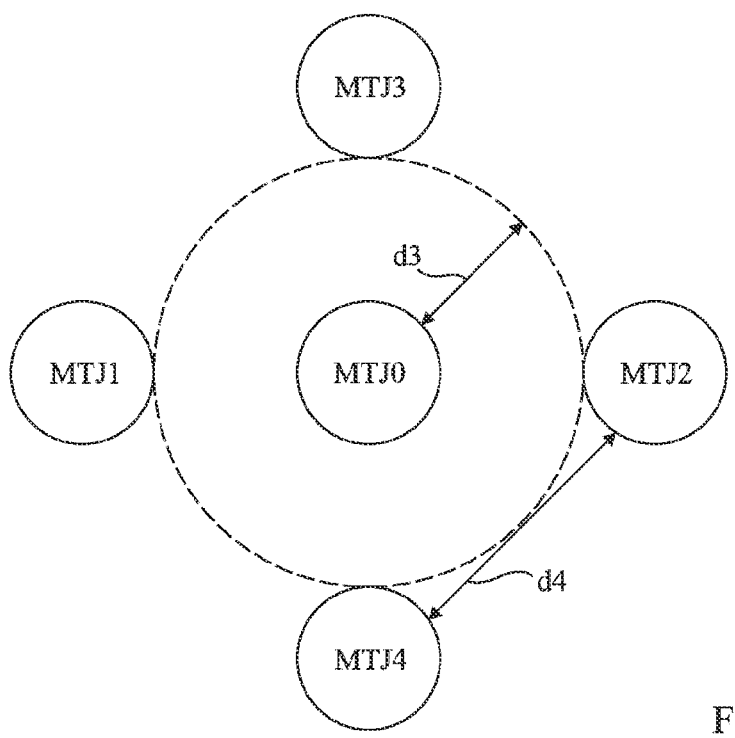
FIG. 4B is a plan view schematically illustrating magnetoresistive elements of the memory cell of FIG. 2 according to yet a further example embodiment of the present disclosure.

FIG. 4B is a plan view of an arrangement of magnetoresistive elements of STT type with perpendicular-to-plane magnetic anisotropy according to a further example in which there are five elements, the element MTJ0 being placed in the centre, and the four other elements MTJ1 to MTJ4 forming a circle around the element MTJ0, each being at equal distance from the element MTJ0. In particular, each element MTJ1 to MTJ4 for example has its inside edge aligned on a circle shown by a dashed line in FIG. 4B, which is a distance d3 from the outer edge of the element MTJ0, for example equal to around 100 nm. A distance d4 separating the adjacent elements MTJ1 to MTJ4 is for example significantly greater than d3 in order to avoid magnetic coupling between these elements. In alternative embodiments there could be more than four elements positioned around the central element MTJ0, for example five or six such elements.

Figure 5:
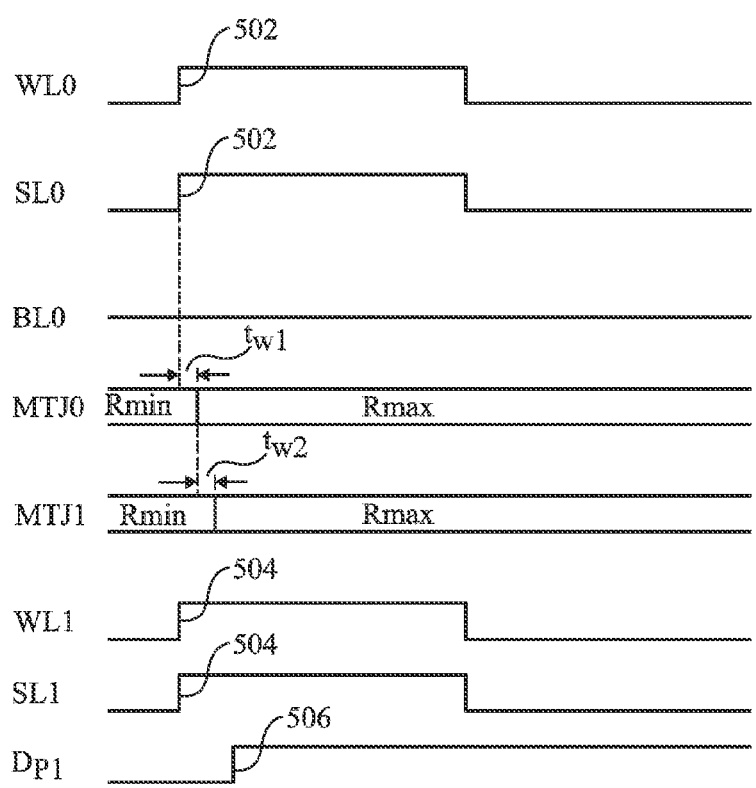
FIG. 5 is a timing diagram showing examples of signals in the memory cell of FIG. 2 according to an example embodiment of the present disclosure.

FIG. 5 is a timing diagram illustrating an example of the signals WL0, SL0, BL0, the resistive states of elements MTJ0, MTJ1, and the signals WL1, SL1 and DP1 of FIG. 2 during a write operation of the element MTJ0 and a read operation of the element MTJ1.

Rising edges 502 of the signals WL0 and SL0 for example initiate the write operation by causing a programming current to flow through the element MTJ0. The programming current density for example has a level in the region of 106 A/cm2. This causes the resistive state of the element MTJ0 to rapidly change, in this example from a resistance Rmin to a resistance Rmax, after a write time of tw1. This write time is for example in the region of 0.1 to 10 ns. The new programmed state of the element MTJ0 then causes the element MTJ1 to be programmed due to magnetic coupling between the free layers of elements MTJ0 and MTJ1. Thus after a write time tw2 from the change of the resistive state of element MTJ0, the resistive state of element MTJ1 also changes. The write time tw2 is for example in the region of 1 to 100 ps.

In the example of FIG. 5, the elements MTJ0 and MTJ1 are of STT type with in-plane magnetic anisotropy, and thus the resistive state of the element MTJ1 also changes from Rmin to Rmax. Alternatively, if the elements MTJ0 and MTJ1 are of STT type with perpendicular-to-plane magnetic anisotropy, the element MTJ1 would have the opposite programming, changing from resistive state Rmax to resistive state Rmin.

As shown by rising edges 504 of the signals WL1 and SL1, a read operation of the element MTJ1 is for example performed at the same time as the write operation of element MTJ0. The write operations of the elements MTJ0, MTJ1 being very rapid, the read operation is able to detect the new programmed state of the element MTJ1, and the data signal DP1 thus changes a short time later to a high level as shown by rising edge 506, which is assumed to correspond to a resistive state Rmax.

An advantage of the embodiments described herein is that a multiport memory cell is provided that can be programmed in a simple manner. Furthermore, because the magnetoresistive elements forming each memory cell remain electrically isolated from each other, there is a low risk of multiple read operations affecting the programmed states of the elements, leading to robust data storage. Additionally, it is possible to perform a read operation during the same cycle as a write operation of the same cell, leading to a reduced access time. Yet a further advantage is that it is possible to tune the materials and/or shape of the MTJs such that one or more MTJs of each cell are adapted for read operations, and one or more other MTJs each cell are adapted for write operations.

Having thus described at least one illustrative embodiment, various alterations, modifications and improvements will readily occur to those skilled in the art.

For example, it will be apparent to those skilled in the art that while certain examples of dimensions and arrangements of magnetoresistive devices have been described, there are many alternative embodiments that could be used. For example, such embodiments could be determined by resolving Maxwell's equations and simulating the behaviour of micro magnetic materials using one or more of the following tools (the various names may correspond to registered trademarks):

Flux3D from the company CEDRAT (http://www.cedrat.com/fr/logiciels/flux.html);

Comsol Multiphysics® from the company COMSOL (http://www.comsol.com/model/the-magnetic-field-from-a-permanent-magnet-78);

OOmmF (open source code) (http://math.nist.gov/oommf/); and

Fastmag from the University of California, San Diego (http://cem.ucsd.edu/index_files/fastmag.html).

Furthermore, it will be apparent to those skilled in the art that, in the embodiments described herein, any of the NMOS transistors could be replaced by PMOS transistors and vice versa, and while transistors based on MOS technology are described, in alternative embodiments other transistor technologies could be used, such as bipolar technology.

Furthermore, it will be apparent to those skilled in the art that the various features described in relation to the various embodiments could be combined, in alternative embodiments, in any combination.

The invention claimed is:

1. A multiport memory cell comprising:

first and second magnetoresistive elements each programmable to have one of at least two resistive states, wherein:

the first magnetoresistive element is coupled to a first output line and is programmable by the direction of a current passed through it; and the second magnetoresistive element is coupled to a second output line and is arranged to be magnetically coupled to the first magnetoresistive element, the second magnetoresistive element being programmable by a magnetic field generated by the first magnetoresistive element.

2. The memory cell of claim 1, further comprising at least one further magnetoresistive element programmable to have one of at least two resistive states, wherein each of the at least one further magnetoresistive element is arranged to be programmable by a magnetic field generated by the first or second magnetoresistive element.

3. The memory cell of claim 1, wherein said second magnetoresistive element comprises a free ferromagnetic layer arranged to be programmed by a magnetic field generated by a free ferromagnetic layer of the first magnetoresistive element.

4. The memory cell of claim 1, further comprising a magnetic flux guide arranged to guide magnetic flux between the first and second magnetoresistive elements.

5. The memory cell of claim 1, wherein said first and second magnetoresistive elements comprise free ferromagnetic layers of different dimensions from each other.

6. The memory cell of claim 1, wherein the average resistance of the resistive states of the first magnetoresistive element is lower than that of the second magnetoresistive element.

7. The memory cell of claim 1, wherein each of the first and second magnetoresistive elements is one of:

a magnetic tunnel junction with in-plane anisotropy; and a magnetic tunnel junction with perpendicular-to-plane anisotropy.

8. The memory cell of claim 1, wherein:

the first and second magnetoresistive elements are magnetic tunnel junctions with in-plane anisotropy;

the second magnetoresistive element is further programmable by a current passed through it; and the first magnetoresistive element is further programmable by a magnetic field generated by the second magnetoresistive element.

9. The memory cell of claim 1, further comprising at least one further magnetoresistive element programmable to have one of at least two resistive states, and wherein the first, second and at least one further magnetoresistive elements are magnetic tunnel junctions with in-plane anisotropy arranged in a line.

10. The memory cell of claim 1, wherein the first and second magnetoresistive elements are magnetic tunnel junctions with in-plane anisotropy separated from each other by a distance of between 100 and 300 nm.

11. The memory cell of claim 1, further comprising at least one further magnetoresistive element programmable to have one of at least two resistive states, and wherein the first, second and at least one further magnetoresistive elements are magnetic tunnel junctions with perpendicular-to-plane anisotropy, and wherein the second and at least one further magnetoresistive elements are each positioned an equal distance from said first magnetoresistive element.

12. A memory device comprising:

an array of the memory cells of claim 1; and a read/write circuit adapted to program the resistive state of said first magnetoresistive element and read the resistive state of said second magnetoresistive element.

13. A method of forming a multiport memory cell comprising:

forming first and second magnetoresistive elements each programmable to have one of at least two resistive states, the elements being separated by a distance chosen such that the second magnetoresistive element is magnetically coupled to the first magnetoresistive element and is programmable by a magnetic field generated by the first magnetoresistive element;

coupling the first magnetoresistive element to a first output line; and coupling the second magnetoresistive element to a second output line.

14. The method of claim 13, further comprising forming a magnetic flux guide for guiding magnetic flux between the first and second magnetoresistive elements.

* * * * *